(12) United States Patent
Amishiro et al.

(10) Patent No.: US 7,821,078 B2
(45) Date of Patent: Oct. 26, 2010

(54) SEMICONDUCTOR DEVICE HAVING RESISTOR ELEMENTS AND METHOD FOR MANUFACTURING THE SAME

(75) Inventors: Hiroyuki Amishiro, Tokyo (JP); Toshio Kumamoto, Tokyo (JP); Motoshige Igarashi, Tokyo (JP); Kenji Yamaguchi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 274 days.

(21) Appl. No.: 12/007,496

(22) Filed: Jan. 11, 2008

(65) Prior Publication Data

US 2008/0116526 A1 May 22, 2008

Related U.S. Application Data

(60) Division of application No. 11/384,244, filed on Mar. 21, 2006, which is a continuation of application No. 09/960,495, filed on Sep. 24, 2001, now Pat. No. 7,045,865.

(30) Foreign Application Priority Data

Mar. 5, 2001 (JP) ............................. 2001-059948

(51) Int. Cl.
*H01L 27/088* (2006.01)
(52) U.S. Cl. ...................... 257/379; 438/382
(58) Field of Classification Search ................ 257/379; 438/382
See application file for complete search history.

(56) References Cited

U.S. PATENT DOCUMENTS

| | | | |
|---|---|---|---|
| 4,326,213 A * | 4/1982 | Shirai et al. | ................ 257/528 |
| 4,384,299 A | 5/1983 | Raffel et al. | |
| 5,135,882 A | 8/1992 | Karniewicz | |
| 5,589,708 A | 12/1996 | Kalnitsky | |
| 5,773,871 A | 6/1998 | Boyd et al. | |
| 6,104,277 A | 8/2000 | Iniewski et al. | |
| 6,121,643 A | 9/2000 | Gardner et al. | |
| 6,130,139 A | 10/2000 | Ukeda et al. | |
| 6,232,104 B1 | 5/2001 | Lishanski et al. | |
| 6,284,599 B1 | 9/2001 | Mehrad et al. | |
| 6,285,066 B1 | 9/2001 | Meyer | |
| 6,340,833 B1 | 1/2002 | Liu et al. | |
| 6,365,481 B1 | 4/2002 | Bonser et al. | |
| 7,045,865 B2 | 5/2006 | Amishiro et al. | |

(Continued)

OTHER PUBLICATIONS

Wolf, S., Silicon Processing for the VLSI ERA-vol. 2: Process Integration, 1990 by Lattice Press, vol. 2, pp. 48-49.

(Continued)

*Primary Examiner*—Thao X Le
*Assistant Examiner*—Tanika Warrior
(74) *Attorney, Agent, or Firm*—McDermott Will & Emery LLP

(57) ABSTRACT

A semiconductor device of the invention has a plurality of resistor elements formed on an element isolating oxide film in predetermined regions on a surface of a semiconductor substrate. Active regions are furnished close to the resistor elements. This allows the element isolating oxide film near the resistor elements to be divided into suitable strips, forestalling a concave formation at the center of the element isolating oxide film upon polishing of the film by CMP and thereby enhancing dimensional accuracy of the resistor elements upon fabrication.

10 Claims, 9 Drawing Sheets

U.S. PATENT DOCUMENTS

2002/0004270 A1 1/2002 Moriwaki et al.
2002/0033519 A1 3/2002 Babcock et al.
2002/0070424 A1 6/2002 Uenishi
2002/0084886 A1 7/2002 Wu

OTHER PUBLICATIONS

Van Zant, Peter, Microchip Fabrication (2000), McGraw-Hill, Fourth Edition, pp. 30-31.

Wolf, S., Silicon Processing for the VLSI Era (2000), Lattice Press, Second Edition, vol. 1, p. 301.

Illingworth, Dictionary of Electronics (1998), Penguin Books, Third Edition, pp. 4, 366-367.

United States Office Action issued in U.S. Appl. No. 11/384,244 dated on Dec. 11, 2008.

U.S. Office Action issued in U.S. Appl. No. 11/384,244, dated Mar. 19, 2008.

* cited by examiner

Fig. 12
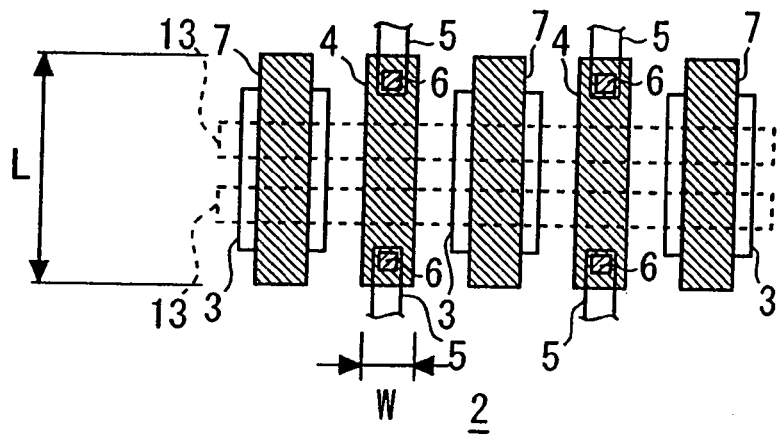
Fig. 13B (PRIOR ART)
Fig. 13A (PRIOR ART)
Fig. 13C (PRIOR ART)
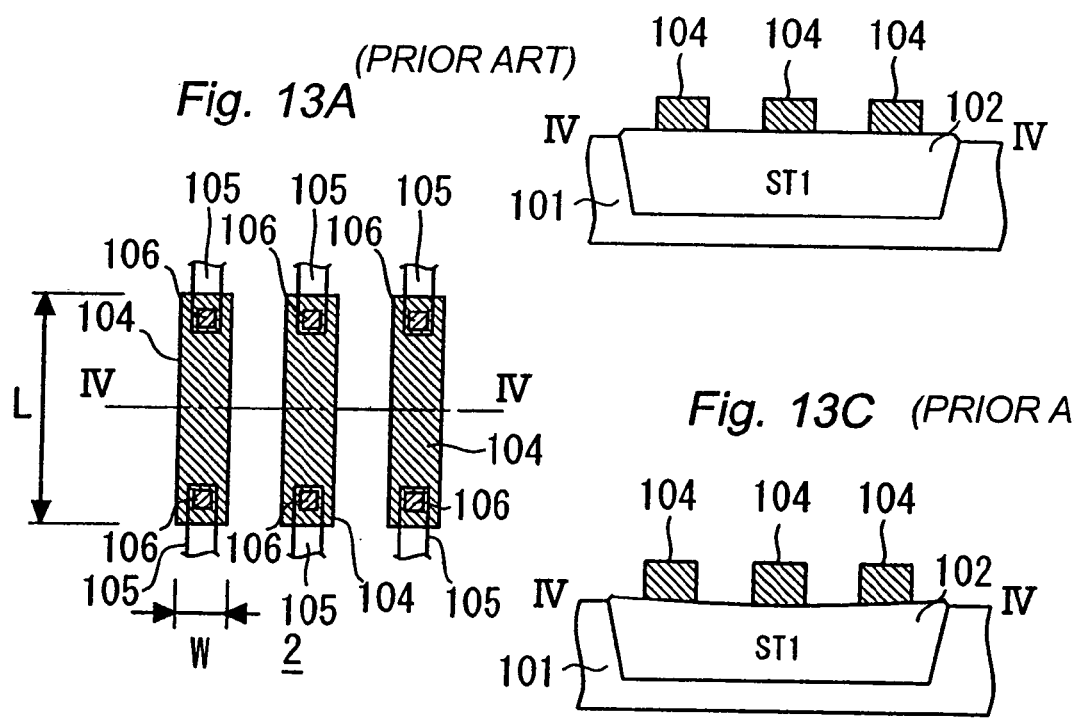

SEMICONDUCTOR DEVICE HAVING RESISTOR ELEMENTS AND METHOD FOR MANUFACTURING THE SAME

RELATED APPLICATIONS

This application is a Divisional of U.S. application Ser. No. 11/384,244, filed Mar. 21, 2006, which is a Continuation of application Ser. No. 09/960,495, filed Sep. 24, 2001, now U.S. Pat. No. 7,045,865, claiming priority of Japanese Application No. 2001-059948, filed Mar. 5, 2001, the entire contents of each of which are hereby incorporated by reference.

BACKGROUND OF THE INVENTION

1. Field of the Invention

The present invention relates to a semiconductor device and a method for manufacturing the semiconductor device. More particularly, the invention relates to a semiconductor device comprising resistor elements and to a method for manufacturing that device.

2. Background Art

Resistor elements included in a semiconductor device fall into two major categories: diffusion resistances utilizing a diffusion layer formed on the surface of a semiconductor substrate, and polysilicon resistances employing a polycrystal silicon film. The resistor elements composed of polysilicon resistances are furnished in many cases over an element isolating film on the semiconductor substrate.

FIGS. 13A, 13B and 13C are schematic views showing how resistor elements are formed illustratively using a gate layer on an element isolating oxide film. FIG. 13A is a plan view of a semiconductor device comprising resistor elements, and FIGS. 13B and 13C are cross-sectional views taken on a dashed line IV-IV in FIG. 13A.

As semiconductor devices are getting finer in structure today, it is customary to have their elements isolated by the so-called shallow trench isolation (STI) process involving chemical mechanical polishing (CMP). With the semiconductor shown in FIGS. 13A through 13C, element isolation over a semiconductor substrate 101 is accomplished by means of an element isolating oxide film 102 formed by STI. The element isolating oxide film 102 is manufactured by STI as follows: trenches are first etched on the semiconductor substrate 101. The trenches are then filled with an insulating film such as a silicon oxide film deposited all over the substrate surface. Excess insulating film portions outside the regions covering the trenches are removed by CMP, leaving the insulating film regions in place.

With the semiconductor device in FIGS. 13A through 13C, a plurality of resistor elements 104 are formed on the element isolating oxide film 102 after fabrication of the film 102. Each resistor element 104 is connected in a subsequent wiring process to a wiring layer 105 located above the element with a contact layer 106 interposed therebetween. The resistor elements 104 measure about 100 µm in total length (L) each. Because a large number of resistor elements 104 need to be formed on the semiconductor substrate 101, it is common practice to form initially an extensive element isolating oxide film 102 and then deposit the numerous resistor elements 104 collectively over the film 102.

The resistance value of the resistor elements 104 thus manufactured is determined by diverse factors: pattern width, total element length and element thickness, as well as by the manner in which the film is grown, the density of impurities implanted, profiles in the direction of thickness, and the type of heat treatment applied.

One disadvantage involved in forming the element isolating oxide film 102 over an extensive area is what is known as the "oxide dishing" problem occurring during planarization by CMP, a phenomenon in which the middle portion of the film 102 tends to become thinner than the remaining portions of the film. The problem is attributable to the fact that the amount of CMP becomes greater the closer the polishing location to the center of the element isolating oxide film 102 away from its periphery. The dishing phenomenon results in a concave formation in the middle of the element isolating oxide film 102, as shown in FIG. 13C.

Manufacturing the resistor elements 104 on such a concave-shaped element isolating oxide film 102 leads to differences in shape between the elements 104 in the middle of the film 102 on the one hand, and the elements 104 near the periphery of the film on the other hand.

The differences in element shape take on three major manifestations: (1) a polycrystal silicon film, formed as the material of the resistor elements 104 on the concave-shaped element isolating oxide film 102, tends to be thicker in the middle than near the periphery; (2) the staggered heights of the resistor elements 104 cause differences in width between the elements 104; and (3) there occur differences in cross-sectional shape between the resistor elements 104. Those differences become more pronounced the greater the width of the element isolating oxide film 102.

FIG. 14 is a characteristic diagram, a graphic representation showing relations (plotted by a solid line) of the center height (H) of the element isolating oxide film 102 with regard to the width of the film 102, in comparison with relations (plotted by a dotted line) of the amount of shift in total length ($L_{shift}$) of the resistor elements 104 with respect to the width of the element isolating oxide film 102. As illustrated in FIG. 14, the height of the element isolating oxide film 102 diminishes and the amount of shift in total length of the resistor elements 104 increases the greater the width of film 102. In particular, when the width of the element isolating oxide film 102 is 100 µm, the amount of shift in total length of the resistor elements 104 is as much as 13 percent. That means the shift in resistance value will amount to 13 percent as well.

As outlined above, conventional techniques have so far failed to maintain the resistor elements 104 in a consistent shape during fabrication on the element isolating oxide film 102. The failure has produced differences in resistance value between the resistor elements 104, making it difficult for the elements to be adopted in circuits of high precision requirements such as analog circuits.

SUMMARY OF THE INVENTION

It is therefore an object of the present invention to overcome the above and other deficiencies of the prior art and to provide a semiconductor device wherein resistor elements of a desired shape are formed over an element isolating oxide film for enhanced precision in resistance value thereby offering improved reliability.

It is another object of the invention to provide a semiconductor device wherein regions in which to form resistor elements are arranged more efficiently so as to render the device more suitable to being manufactured in finer structures than before.

According to one aspect of the present invention, a semiconductor device has a plurality of resistor elements formed on an insulating film in predetermined regions on a surface of a semiconductor substrate. The semiconductor device comprises active regions contiguous with the resistor elements.

According to another aspect of the present invention, a method of manufacturing a semiconductor device comprises the following steps. Firstly etching is performed to remove surroundings of a plurality of parallelly arranged strip-shaped rectangular regions in predetermined regions on a semiconductor substrate in order to have trenches formed by the rectangular regions left intact. Secondly the trenches is filled with insulating film formed on the semiconductor substrate. Thirdly surfaces of the insulating film is polished for removal thereof from regions except those of the trenches, thereby the rectangular regions established as active regions and the surfaces of the insulating film on the trenches is planarized. Fourthly conductive film using a material having a predetermined resistance value is formed on the semiconductor substrate. Fifthly the conductive film on the insulating film is patterned so as to form rectangular resistor elements extending between any adjacent two of the active regions and in parallel with the active regions.

According to the present invention, active regions are furnished in a manner contiguous with resistor elements. The structure allows insulating film near the resistor elements to be divided into suitable portions so as to forestall a concave formation at the center of the insulating film upon film polishing by CMP. This improves dimensional precision of the resistor elements and ensures enhanced resistance value consistency.

Other and further objects, features and advantages of the invention will appear more fully from the following description.

BRIEF DESCRIPTION OF THE DRAWINGS

FIG. 12 is a schematic view of a semiconductor device practiced as a fourth embodiment of this invention;

FIGS. 13A, 13B and 13C are schematic views of a conventional semiconductor device.

DETAILED DESCRIPTION OF THE PREFERRED EMBODIMENTS

Preferred embodiments of this invention will now be described with reference to the accompanying drawings.

First Embodiment

Figure 1A:
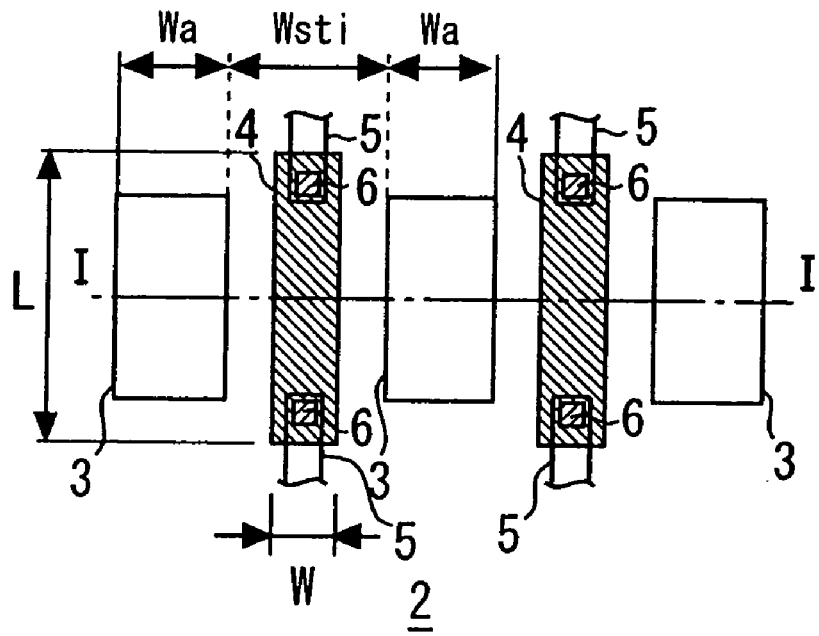
FIGS. 1A and 1B are schematic views of a semiconductor device practiced as a first embodiment of this invention.
Figure 1B:
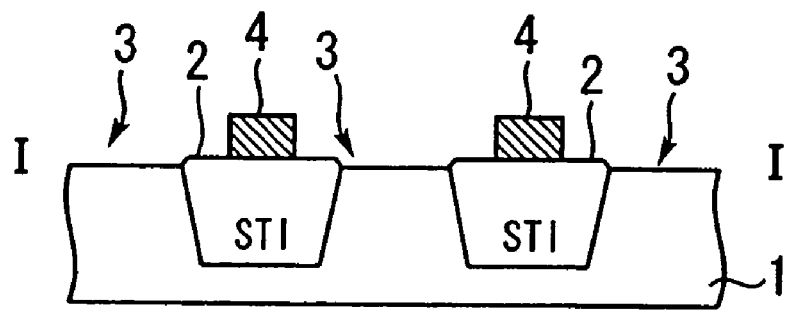

FIGS. 1A and 1B are schematic views of a semiconductor device practiced as the first embodiment of this invention. FIG. 1A is a plan view showing the first embodiment from above, and FIG. 1B is a schematic cross-sectional view taken on a dashed line I-I in FIG. 1A.

How the semiconductor device of the first embodiment is structured will now be described by referring to FIGS. 1A and 1B. This semiconductor device is manufactured by first forming an element isolating oxide film 2 through the STI process on a surface area of a semiconductor substrate 1. Over the element isolating oxide film 2, rectangular resistor elements 4 having a width W each are formed by use of an MOS transistor gate layer. The resistor elements 4 are composed illustratively of a polycrystal silicon film constituting the gate layer. As shown in FIG. 1A, element active regions 3 are formed in a manner contiguous with each resistor element 4 crosswise on both sides. In this structure, the element isolating oxide film 2 is partitioned by the element active regions 3 corresponding to the individual resistor elements 4. The partitions are predetermined in width each.

The resistor elements 4 are covered with an interlayer insulating film (not shown). A wiring layer 5 formed on the interlayer insulating film is connected to both ends of each resistor element 4 via a contact layer 6, as depicted in FIG. 1A. Although simply one contact layer 6 is shown connecting the resistor elements 4 to the wiring layer 5 in FIG. 1A, this is not limitative of the invention. Preferably, there should be provided as many contact layers 6 as would be sufficient to make contact resistance not higher than permissible variations in resistance value of the resistor elements 4. That is, the number of contact layers 6 should preferably satisfy the following expression:

(resistance value of a single contact layer 6)/(number of contact layers 6)≦tolerance rate×(resistance value of resistor elements 4)

As described, the element active layers 3 are formed corresponding to the resistor elements 4, and the width ($W_{sti}$) of the element isolating oxide film 2 is set to a minimum requirement. This prevents the CMP process while forming the element isolating oxide film 2 from thinning its middle portion producing a concave formation.

The element active regions 3 determine the width of the element isolating oxide film 2, dividing the film into strips. Thus there is no specific constraint on the width ($W_a$) of each device active region 3. The smaller the width of each active region 3, the larger the number of resistor elements 4 that may be produced per unit area. Efficiency of laying out the resistor elements 4 is enhanced by reducing the device active regions 3 preferably to a minimum producible width each.

The width ($W_{sti}$) of the element isolating oxide film 2 should preferably be kept less than a permissible amount of size shift dictated by functional viability of the resistor elements 4. The width may be determined illustratively on the basis of measurements shown in FIGS. 13A through 13C. This allows the amount of shift in resistance value of the resistor elements 4 to be held below a predetermined level, so that the resistance of the resistor elements 4 may be set within design tolerance.

How the semiconductor device of the first embodiment is produced will now be described. The element isolating oxide film 2 is first formed by the STI process over the semiconductor substrate 1. More specifically, trenches are etched in predetermined regions on the semiconductor substrate 1. An insulating film such as a silicon oxide film is deposited all over the substrate surface to fill the trenches. Chemical mechanical polishing (CMP) or like process is used to remove the excess insulating film from the semiconductor substrate 1 except from the regions covering the trenches. The process forms the element isolating oxide film 2 filling the predetermined regions on the substrate surface. In the regions where resistor elements 4 are to be formed, the element active regions 3 are laid out in a manner dividing the element isolating oxide film 2 into strips so that the width of each film strip will be $W_{sti}$ or less.

A polycrystal silicon film is then formed in a way covering the semiconductor substrate 1. Impurities are added to the polycrystal silicon film to afford the film a predetermined degree of conductivity. After this, the polycrystal silicon film is patterned first by photolithography and then by dry etching into the resistor elements 4 on the element isolating oxide film 2. While the resistor elements 4 are being patterned, gate electrodes are patterned simultaneously from the polycrystal silicon film in the regions where MOS transistors are to be produced.

An interlayer insulating film covering the resistor elements 4 is then formed. Contact holes reaching both ends of each resistor element 4 are opened, followed by fabrication of contact layers 6 filling the contact holes. A wiring layer connected to the contact layers 6 is then formed on the interlayer insulating film and patterned thereon, whereby the semiconductor device shown in FIGS. 1A through 1B is completed.

As described above, the first embodiment is manufactured first by forming the resistor elements 4 on the element insulating oxide film 2 and then by constituting the element active regions 3 in a manner contiguous with each resistor element 4 crosswise on both sides. This allows the element isolating oxide film 2 in the regions in which to form the resistor elements 4 to be divided into strips corresponding to the individual elements 4. The process sets each strip of the element isolating oxide film 2 to a minimum width requirement and appreciably enhances flatness on the surface of the element isolating oxide film 2 upon polishing by CMP. That makes it possible to form the resistor elements 4 each with a desired resistance value and in a consistent shape over the strips of the element isolating oxide film 2, whereby the resistor elements 4 are arranged to have a uniform resistance value.

When the width ($W_{sti}$) of the element isolating oxide film 2 is held below a permissible amount of size shift dictated by functional viability of the resistor elements 4, the resistance value of the resistor elements 4 can be established within design tolerance. This makes it possible for the resistor elements 4 to constitute semiconductor devices whose reliability is high enough to meet high precision requirements such as those of analog circuits.

Second Embodiment

Figure 2A:
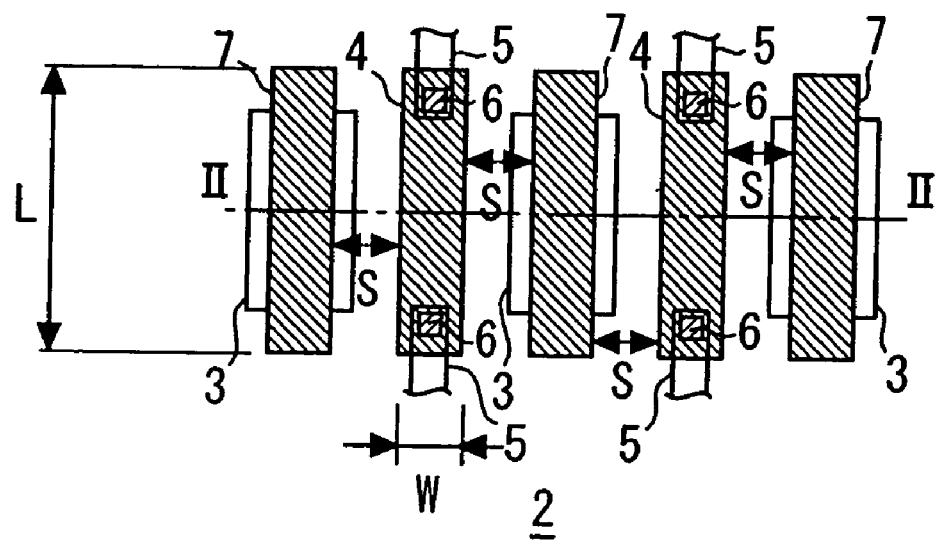
FIGS. 2A and 2B are schematic views of a semiconductor device practiced as a second embodiment of this invention.
Figure 2B:
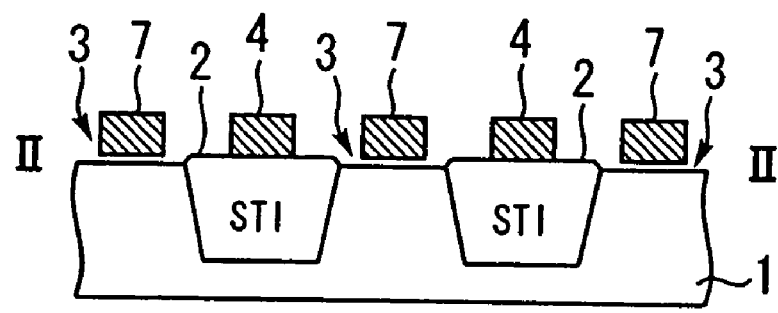

FIGS. 2A and 2B are schematic views of a semiconductor device practiced as the second embodiment of this invention. FIG. 2A is a plan view showing this semiconductor device of the second embodiment from above, and FIG. 2B is a schematic cross-sectional view taken on a dashed line II-II in FIG. 2A.

The semiconductor device of the second embodiment is structurally the same as that of the first embodiment in that the element active regions 3 flanking each resistor element 4 crosswise on both sides determine the width of the element isolating oxide film 2. The difference lies where the second embodiment has dummy gate electrodes 7 formed on the element active regions 3 on both sides of each resistor element 4, as shown in FIG. 2A. In describing the second and other embodiments of this invention below, their components having the same or corresponding functions as their counterparts in the first embodiment of FIGS. 1A through 1B are designated by like reference numerals, and their descriptions are omitted where redundant.

As depicted in FIGS. 2A and 2B, the dummy gate electrodes 7 formed over the element active regions 3 each have approximately the same shape and size as the resistor elements 4. The dummy gate electrodes 7 are narrower than the element active regions 3 as shown in FIG. 2A, and are arranged substantially in parallel with the resistor elements 4 and formed in a manner spanning the element active regions 3 over the element isolating oxide film 2.

As with the resistor elements 4, the dummy gate electrodes 7 are formed using the same gate layer as in the regions where the MOS transistor are to be formed. Thus the dummy gate electrodes 7 are produced over the element active regions 3 with a gate oxide film interposed therebetween.

As indicated in FIG. 2A, a constant gate space S separates each of a plurality of resistor elements 4 from the dummy gate electrodes 7 corresponding to these elements. When the gate space S is made constant between the multiple resistor elements 4 each supposed to have an identical resistance value, it is indeed possible to let each resistor element 4 acquire the same resistance value. Preferably, the gate space S should be brought as close to a minimum pattern spacing over the semiconductor substrate 1 as possible.

In ordinary processes of semiconductor device fabrication, the process conditions are optimized in accordance with a minimum pattern spacing in effect. That means the greater the gate space S, the less likely the process conditions are satisfied, worsening pattern size precision of the resistor elements 4. Because the second embodiment keeps the gate space S close to the minimum pattern spacing, the resistor elements 4 and dummy gate electrodes 7 have high degrees of precision in shape dimensions.

Since the dummy gate electrodes 7 are used not as resistor elements but as something designed to enhance the precision in shape of the resistor elements 4, the electrodes 7 are connected to ground potential so as to minimize noise components. The element active regions 3 under the dummy gate electrodes 7 should preferably be set to the same potential as that of wells. This would require connecting the regions 3 to contact holes to acquire the same potential as the wells, or forming the regions 3 so as to have the same conductivity type as that of the wells.

Figure 3:
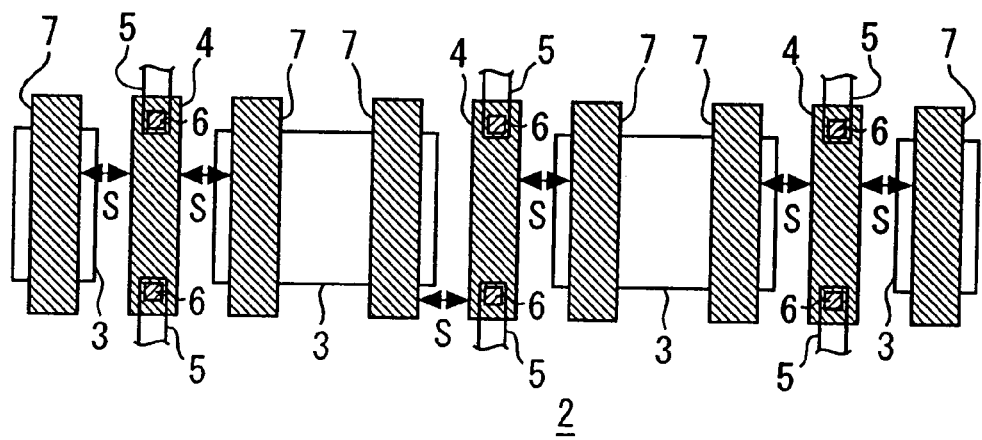
FIG. 3 is a schematic view of another semiconductor device practiced as the second embodiment.

Another typical semiconductor device constituting the second embodiment will now be described by referring to a top view of FIG. 3. The semiconductor device in FIG. 3 shows that where the element active regions 3 formed between the resistor elements 4 have a relatively large width each, the dummy gate electrodes 7 on the element active regions 3 are formed close to the elements 4 on the element isolating oxide film 2.

In the second embodiment, the dummy gate electrodes 7 are positioned close to the resistor elements 4 without being restricted by the width or size of the element active regions 3, whereby the resistor elements 4 is prevented from deteriorating in shape. When the spacing between the dummy gate electrodes 7 corresponding to multiple resistor elements 4 on the one hand and these elements 4 on the other hand is arranged to be the same as the gate space S, the process conditions are satisfied so that precision in size of each resistor element 4 is improved. Preferably, if the spacing is made the same as the gate space S between the dummy gate electrodes 7 for the multiple resistor elements 4 having an identical resistance value each on the one hand, and these resistor elements 4 on the other hand, then the resistor elements 4 are allowed to have the same resistance value each as well. The structure further permits gate wiring to pass between the dummy gate electrodes 7 over the element active regions 3.

Figure 4:
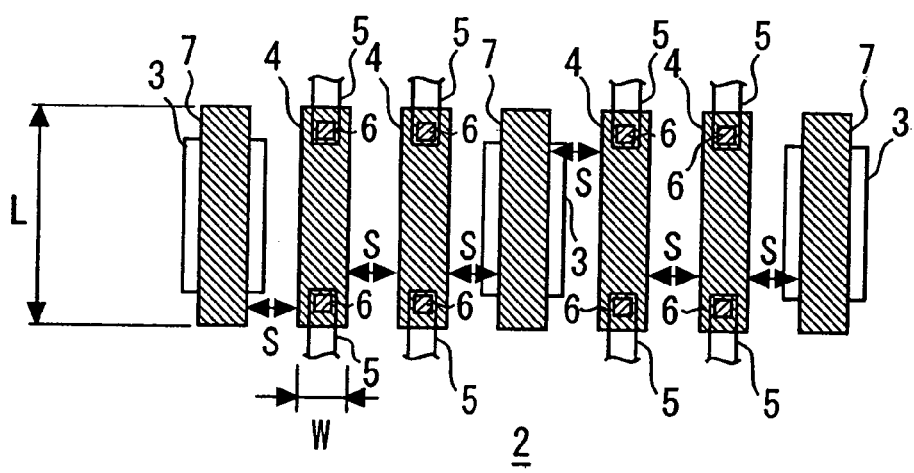
FIG. 4 is a schematic view of another semiconductor device practiced as the second embodiment.

Another typical semiconductor device constituting the second embodiment will now be described by referring to a top view of FIG. 4. The semiconductor device in FIG. 4 shows that dummy gate electrodes 7 are formed over the element active regions 3 and that a plurality of resistor elements 4 are laid out on the element isolating oxide film 2. In this example, too, it is preferred to make the spacing the same as the gate space S between the multiple resistor elements 4 on the one hand and the dummy gate electrodes 7 on the other hand, as well as to bring the gap between the resistor elements 4 on the element isolating oxide film 2 to the same gate space S. More preferably, if the spacing is made the same as the gate space S between multiple resistor elements 4 supposed to have an identical resistance value each on the one hand, and the dummy gate electrodes 7 or other resistor elements 4 on the other hand, then the resistor elements 4 are allowed to acquire the same resistance value each.

As described, when the resistor elements 4 are formed close to one another on the element isolating oxide film 2 and when the elements 4 are located near the dummy gate electrodes 7, the wiring in the vicinity of the resistor elements 4 is made structurally uniform constituting a layout germane to achieving enhanced precision. Preferably, the spacing between the adjacent resistor elements 4 or between the elements 4 and the dummy gate electrodes 7 should be set to the same gate space S for each element 4. This structure arranges the resistor elements 4 in a crosswise (vertically) symmetrical manner, thereby boosting matching accuracy and shaping each resistor element 4 in such a manner that the resistor elements 4 will obtain the same resistance value each. In the example of FIG. 4, even if a plurality of resistor elements 4 are formed on the element isolating oxide film 2, each resistor element 4 maintains a high degree of dimensional precision. Furthermore, locating multiple resistor elements 4 on the element isolating oxide film 2 improves the efficiency of resistor element layout.

Figure 5A:
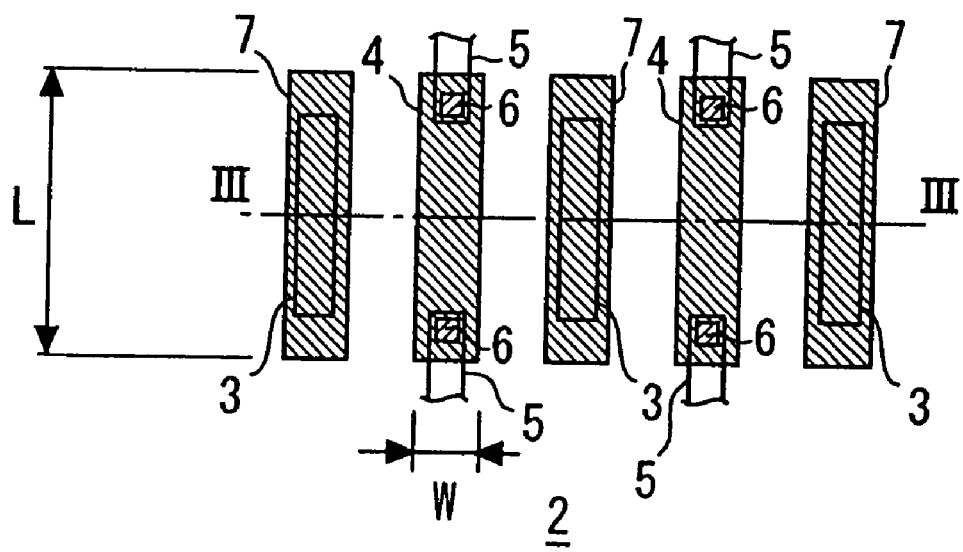
FIGS. 5A and 5B are schematic views of another semiconductor device practiced as the second embodiment.
Figure 5B:
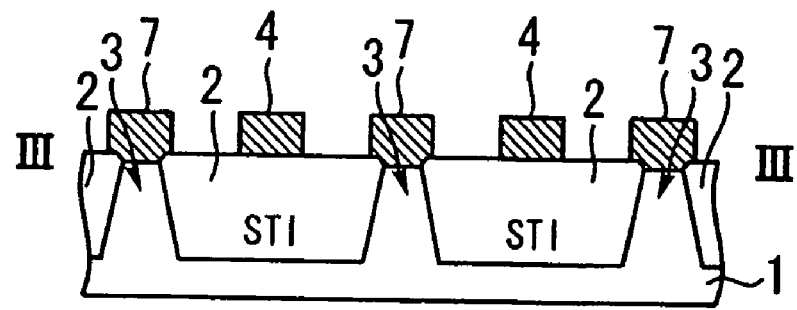

Another typical semiconductor device constituting the second embodiment will now be described by referring to FIGS. 5A and 5B. The semiconductor device in FIGS. 5A and 5B shows that dummy gate electrodes 7 each wider than an element active region 3 cover the active regions 3 completely. FIG. 5A is a plan view showing this semiconductor device of the second embodiment from above, and FIG. 5B is a schematic cross-sectional view taken on a dashed line III-III in FIG. 5A.

If the element active region 3 are both covered and exposed in an intermittent, irregular manner as they are overlaid with the dummy gate electrodes 7, the electrodes 7 cannot remain constant in shape when manufactured. In such a case, it becomes difficult to keep the resistor elements 4 constant in shape. As shown in FIGS. 5A and 5B, if element active regions 3 are formed on both sides of each resistor element 4, with each region 3 narrower than each electrode 7 and with each dummy gate electrode 7 covering entirely each element active region 3, then the dummy gate electrodes 7 are manufactured stably in terms of shape. Where the stably shaped dummy gate electrodes 7 are located close to the resistor elements 4, the elements 4 may be produced in a way consistent in shape while maintaining high levels of dimensional accuracy.

Because the element active regions 3 serve to divide the element isolating oxide film 2 into strips, the regions 3 are not subject to any specific constraints in terms of widths, as mentioned above. That means reducing the width of each element active region 3 allows the strips of the element isolating oxide film 2 to enlarge in width so as to improve the efficiency in arranging the resistor elements 4.

Figure 6:
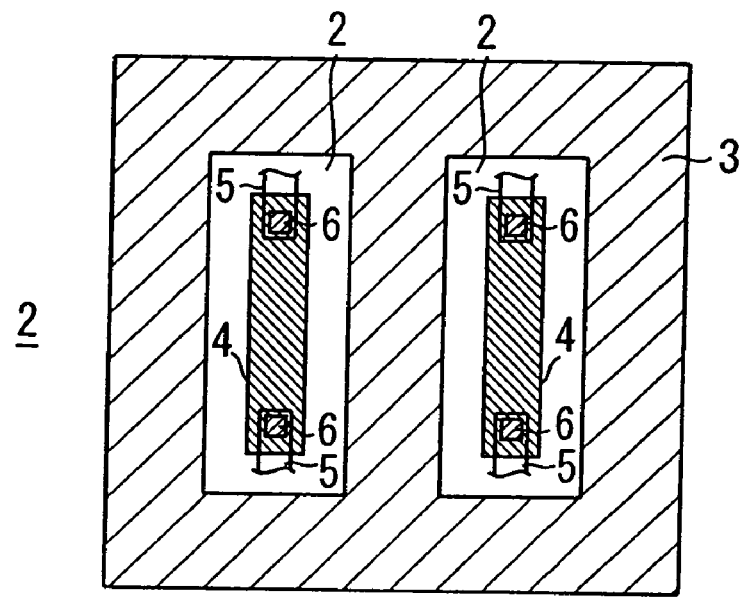
FIG. 6 is a schematic view of another semiconductor device practiced as the second embodiment.

Another typical semiconductor device constituting the second embodiment will now be described by referring to FIG. 6. The semiconductor device in FIG. 6 shows that element active regions 3 are formed so as to surround those strips of an element isolating oxide film 2 in which resistor elements 4 are manufactured. When the resistor elements 4 are surrounded by the element active regions 3 as illustrated, the strips of the element isolating oxide film 2 are determined dimensionally by the element active regions 3 in not only crosswise but also lengthwise directions relative to the resistor elements 4.

The layout above produces a pattern comprising those independent islands of the element isolating oxide film 2 in which the resistor elements 4 are formed. This ensures planarization during polishing by CMP, whereby the hitherto-experienced concave formation at the center is averted.

Figure 7:
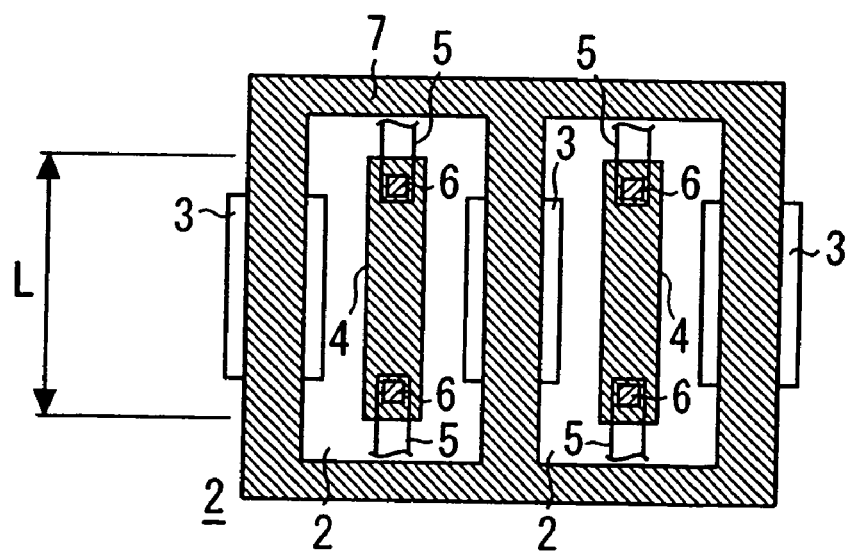
FIG. 7 is a schematic view of another semiconductor device practiced as the second embodiment.

Another typical semiconductor device constituting the second embodiment will now be described by referring to FIG. 7. The semiconductor device of FIG. 7 is structurally the same as that of FIG. 2 in terms of layout of the element active regions 3. The difference is that each resistor element 4 is surrounded by dummy gate electrodes 7.

Having the resistor elements 4 surrounded by the dummy gate electrodes 7 allows the elements 4 to be manufactured with high precision in shape. In particular, the resistor elements 4 can be produced accurately in shape at their extremities in the lengthwise direction. If the gap between the resistor element 4 and the dummy gate electrode 7 is set equal to a minimum gate space S as described above, the resistor elements 4 may be manufactured with extremely high precision in terms of shape.

Figure 8:
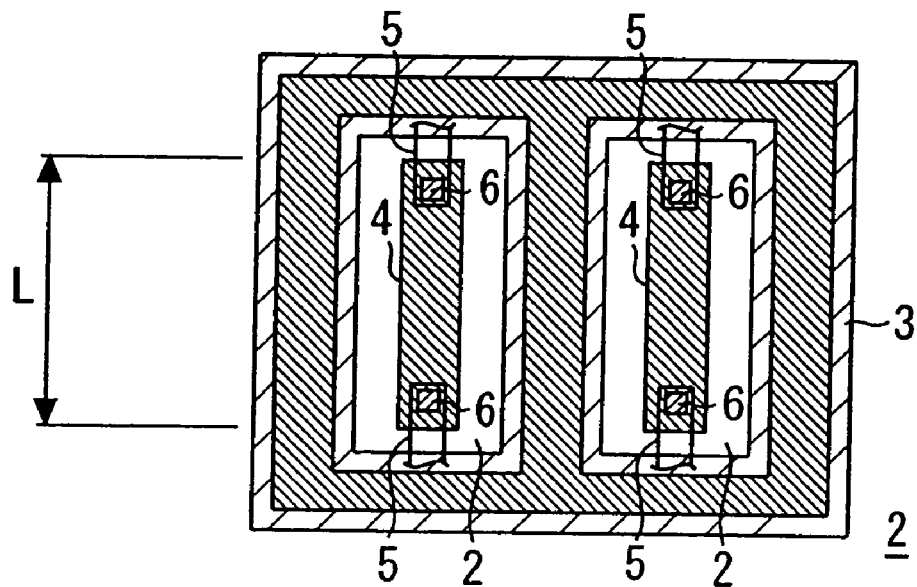
FIG. 8 is a schematic view of another semiconductor device practiced as the second embodiment.

FIG. 8 is a schematic view of another semiconductor device practiced as the second embodiment, the device having resistor elements 4 surrounded by element active regions 3 that are overlaid with dummy gate electrodes 7 surrounding the resistor elements 4. The semiconductor device of FIG. 8 has its element isolating oxide film 2 divided into insular portions so as to ensure planarization of the film 2 during polishing by CMP. When the resistor elements 4 are surrounded by the dummy gate electrodes 7, the elements 4 can be patterned stably in shape.

Figure 9:
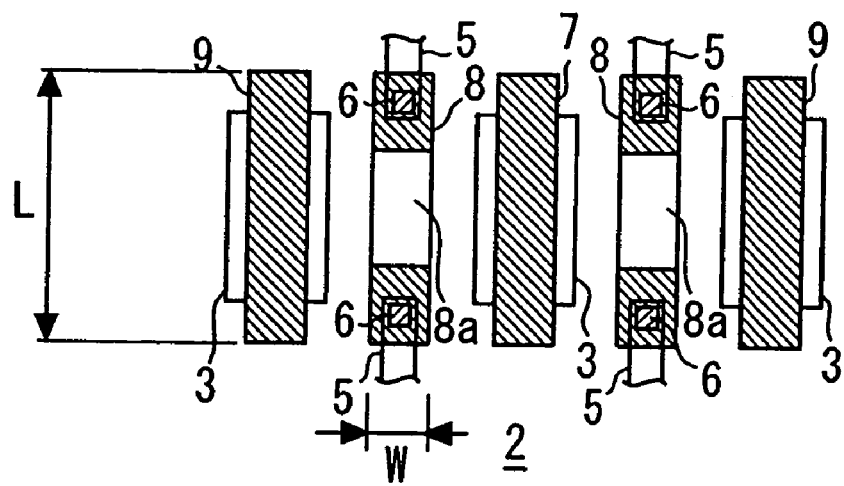
FIG. 9 is a schematic view of another semiconductor device practiced as the second embodiment.

Another typical semiconductor device constituting the second embodiment will now be described by referring to FIG. 9. The semiconductor device of FIG. 9 is shown having resistor elements 8 and dummy gate electrodes 9 manufactured using a stacked layer structure made of a polycrystal silicon film and a silicide film (i.e., polycide gate structure). This setup is particularly advantageous when utilized as a polycide gate structure for manufacturing gate electrodes in regions where MOS transistors are to be formed. The resistor elements 8 have their silicide layer portions removed except from their extremities in order to ensure predetermined resistance values. In the silicide-removed regions, the resistor elements 8 are topped with a lower-layer polycrystal silicon film 8a. The dummy gate electrodes 9, on the other hand, have no specific need to allow for resistance values and are thus covered entirely with the silicide layer.

As described, where the gate electrodes are formed illustratively in a polycide gate structure in the MOS transistor formation regions, it is possible to manufacture the resistor elements 8 and dummy gate electrodes 9 of polycide structures. When the resistor elements 8 have their silicide layer portions removed selectively, the elements 8 can be set to desired resistance values.

The above-described semiconductor devices each constituting the second embodiment of this invention are manufactured by adding the process of forming dummy gate electrodes 7 to the method for manufacturing the first embodiment. Specifically, the semiconductor devices of the second embodiment are manufactured by patterning the dummy gate electrodes 7 like those shown in FIGS. 2A through 5B and 7 through 9 simultaneously with the resistor elements 4 being patterned. To have strips of the element isolating oxide film 2 surrounded by the element active regions 3 as shown in FIG. 6 involves forming rectangular trenches by STI as in the first embodiment in the regions in which the element isolating oxide film 2 is to be furnished. The trenches thus produced are filled with an insulating film such as a silicon oxide film.

As described above, the second embodiment of the invention ensures stable shaping of the resistor elements 4 by having the dummy gate electrodes 7 formed substantially in parallel with the elements 4 over the element active regions 3 in such a manner that the electrodes 7 and the resistor elements 4 are located close to one another. In particular, the resistor elements 4 and dummy gate electrodes 7 are manufactured under optimum process conditions when the gap between the electrodes 7 and the elements 4 is set equal to a minimum pattern space. This makes it possible to manufacture the resistor elements 4 with higher accuracy than ever and to establish their resistance values as desired.

Third Embodiment

Figure 10:
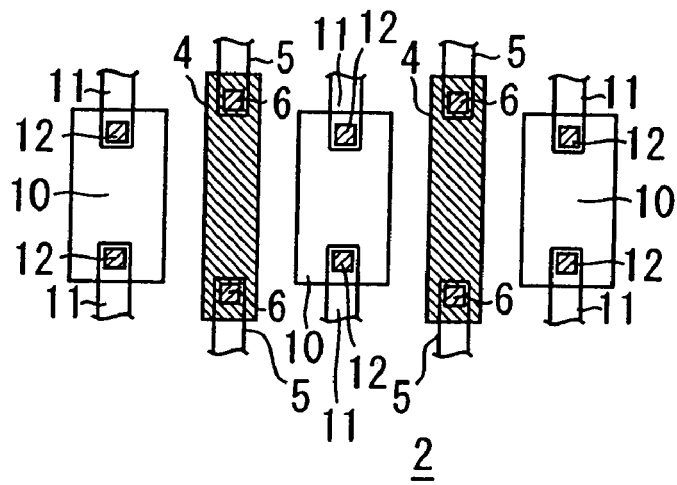
FIG. 10 is a schematic view of a semiconductor device practiced as a third embodiment of this invention.

FIG. 10 is a schematic plan view of a semiconductor device practiced as the third embodiment of this invention, showing a horizontal structure of the device. The semiconductor device of FIG. 10 has diffusion layers 10 formed to function as resistor elements through implantation of impurities into the element active regions 3 of the semiconductor device in FIG. 1. Both ends of each diffusion layer 10 are connected via a contact layer 12 to an upper wiring layer 11.

In the semiconductor device of the third embodiment, as in the first embodiment, an element isolating oxide film 2 with resistor elements 4 formed thereon is divided into strips by the element active regions 3. This ensures planarization of the surface of the element isolating oxide film 2 during polishing by CMP. Forming the diffusion layers 10 in the element active regions 3 makes it possible to produce resistor portions of the diffusion layers 10 (i.e., diffusion layer resistor elements) contiguous with the resistor elements 4 in the same regions.

With that structure, the semiconductor device of the third embodiment improves dimensional accuracy of the resistor elements 4 while making up the diffusion layer resistor elements by use of the element active regions 3 between the resistor elements 4. That is, the resistor elements 4 are manufactured efficiently under limited space constraints.

The method for manufacturing the semiconductor device of the third embodiment involves supplementing the method for manufacturing the first embodiment with the process of implanting impurities into the element active regions 3. Specifically, formation of the element active regions 3 is followed by implantation of appropriate ion impurities into the regions 3. The process turns the element active regions 3 into the diffusion layers 10 having desired resistance values. Thereafter, an interlayer insulating film is furnished, the contact layers 12 connected to the diffusion layers 10 are manufactured, and the wiring layer 11 is produced. This completes the semiconductor device of the third embodiment.

Figure 11:
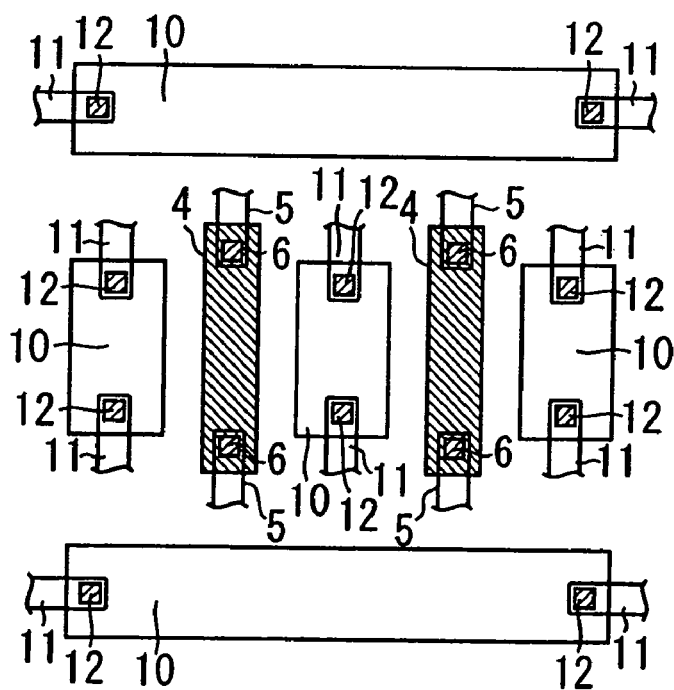
FIG. 11 is a schematic view of another semiconductor device practiced as the third embodiment.
Figure 14:
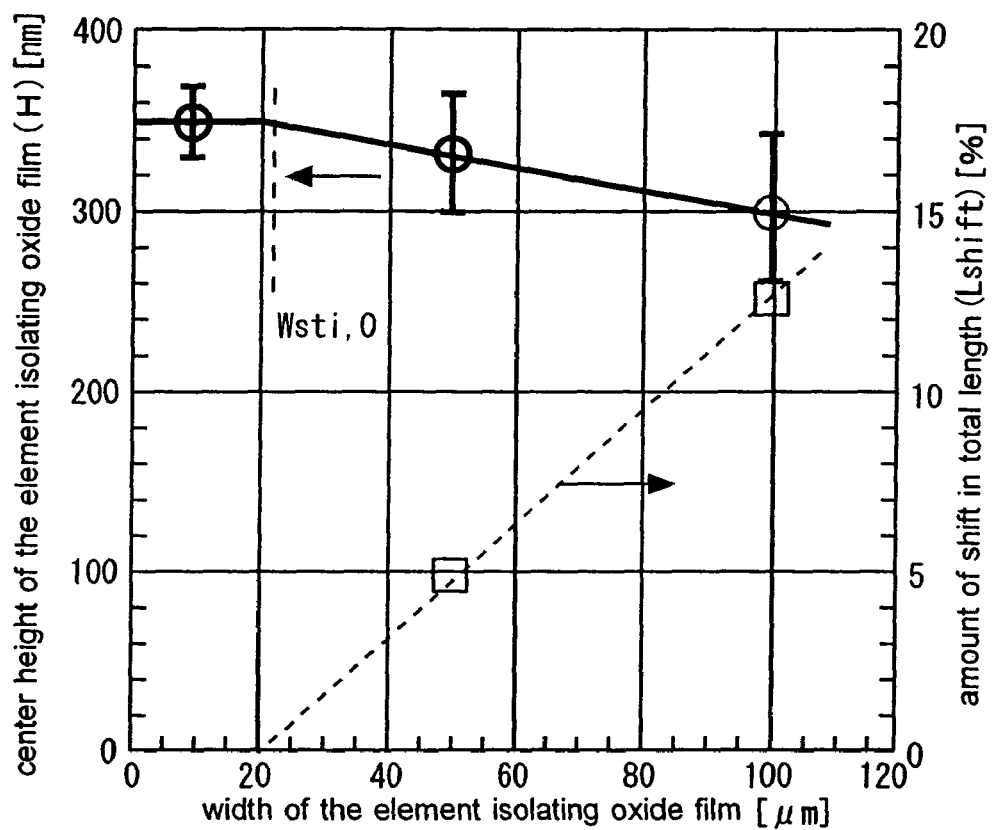
FIG. 14 is a characteristic diagram graphically showing relations of the center height of an element isolating oxide film with regard to the width of the film, in comparison with relations of the amount of shift in total length of resistor elements with respect to the width of the film.

FIG. 11 is a schematic plan view of another semiconductor device practiced as the third embodiment. The semiconductor device of FIG. 11 has element active regions 10 furnished crosswise on both sides of each resistor element 4 and in contact with lengthwise ends of the elements 4. Suitable impurities are implanted into the element active regions 3 to form diffusion layers 10 that function as resistor elements. Both ends of each diffusion layer 10 are connected via a contact layer 12 to an upper wiring layer 11.

When the resistor elements 4 are surrounded crosswise and lengthwise by the diffusion layers 10 (element active regions 3) as described, the element isolating oxide film 2 is kept from expanding and has its flatness improved when polished by CMP. When the element isolating oxide film 2 is turned into diffusion layers 10 that act as resistor elements, both the resistor elements 4 and the diffusion layers 10 may constitute resistor parts. This makes it possible to form the resistor elements in a significantly efficient manner per unit area.

Fourth Embodiment

FIG. 12 is a schematic plan view of a semiconductor device practiced as the fourth embodiment of this invention. The semiconductor device of FIG. 12, as with that of FIG. 2, has dummy gate electrodes 7 formed in element active regions 3 contiguous with both ends of each resistor element 4. A wiring layer 13 is furnished over the resistor elements 4 with an interlayer insulating film interposed therebetween.

Generally, if there is a wiring layer located immediately above resistor elements, the rate of activation in polycrystal silicon film varies under the influence of the wiring layer. That means there occur differences in resistance value between the resistor elements overlaid with a wiring layer immediately above on the one hand, and the resistor elements with no such wiring layer located immediately overhead on the other hand.

The fourth embodiment is characterized by resistor elements 4 covered with a wiring layer 13 immediately above, the elements 4 being overlaid in uniform proportions with the layer 13. More specifically, the ratio of the area of each resistor element 4 to the area of the wiring layer 13 overlapping with the element 4 in question is held constant. In that setup, even if the rate of activation in polycrystal silicon film is altered under the influence of the wiring layer 13, differences in resistance between the resistor elements 4 are substantially eliminated so that the resistor elements 4 have an appreciably uniform resistance value each. Although the resistor elements 4 are preferably made uniform in resistance value by producing the wiring layer 13 under identical conditions with regard to the resistor elements 4 as mentioned above, this is not limitative of the invention. Alternatively, the same effect of resistance value consistency is accomplished by not furnishing any wiring layer 13 over the resistor elements 4.

With the fourth embodiment, as described, the ratio of the area of each resistor element 4 to the area of the wiring layer 13 overlapping with that element 4 is held constant. This arrangement substantially eliminates those differences in resistance value between the resistor elements 4 which have hitherto been attributed to the wiring layer 13. The fourth embodiment thus has the resistor elements 4 manufactured with a substantially uniform resistance value each.

The semiconductor devices and the methods for manufacturing these devices according to the invention offer the following major features and benefits:

According to the invention, active regions are furnished in a manner contiguous with resistor elements. The structure allows insulating film near the resistor elements to be divided into suitable portions so as to forestall a concave formation at the center of the insulating film upon film polishing by CMP. This improves dimensional precision of the resistor elements and ensures enhanced resistance value consistency.

The insulating film may be turned into strips of element isolating film by shallow trench isolation. This improves flatness of the insulating film upon polishing by CMP for planarization.

A plurality of resistor elements may be furnished on the insulating film, and the insulating film under each resistor element may be set to a predetermined width by the active regions. This allows the insulating film near the resistor elements to be divided into necessary strips.

The insulating film width may be determined by an amount of shift in resistance value of the resistor elements, the amount of shift being defined by that film width. This allows the amount of shift in resistance value to be determined as desired.

Regions including the active regions may be furnished with dummy gate electrodes. This prevents patterns of the resistor elements from becoming insular and permits shaping of the resistor elements with high precision.

The dummy gate electrodes may be manufactured wider in area than the active regions that are covered entirely with the dummy gate electrodes. This ensures stable shaping of the dummy gate electrodes, further improving dimensional accuracy of the resistor elements upon fabrication.

Each of the active regions may be furnished with a plurality of dummy gate electrodes. This allows the resistor elements to be located close to the dummy gate electrodes even where the active regions have a relatively wide area each. It is also possible to let gate wiring pass between any adjacent two of the dummy gate electrodes on the active regions.

A distance between each of the resistor elements and each of the dummy gate electrodes may be held constant. This allows the resistor elements to have a uniform resistance value under optimized process conditions.

A plurality of resistor elements may be furnished between any adjacent two of the active regions. This allows the resistor elements to be laid out efficiently.

A distance between a plurality of resistor elements between any adjacent two of the active regions may be set to a minimum space between patterns formed on the semiconductor substrate. This allows the resistor elements to be patterned under optimized process conditions.

The active regions may be extended close to lengthwise ends of the resistor elements that are surrounded by the active regions. This allows the insulating film having the resistor elements formed therein to be each patterned in an insularly independent manner, whereby flatness of the insulating film surface is enhanced upon polishing by CMP.

The dummy gate electrodes may be extended close to lengthwise ends of the resistor elements that are surrounded by the dummy gate electrodes. This allows the resistor elements to be shaped with high dimensional precision.

The resistor elements may be constituted by a polycrystal silicon film and a silicide film stacked to make up a polycide structure, the silicide film being selectively removed from tops of the resistor elements. This permits formation of the resistor elements with desired resistance values where a polycide structure gate layer is utilized.

The dummy gate electrodes may be constituted by a polycrystal silicon film and a silicide film stacked to make up a polycide structure. This ensures stable shaping of the resistor elements where a polycide structure gate layer is utilized.

The active regions may be doped with suitable impurities and connected to contact layers to let the active regions function as diffusion layer resistor elements. This allows the diffusion layer resistor elements to be located close to the resistor elements on the element isolating film, whereby the resistor elements are laid out efficiently.

The active regions may be located close to lengthwise ends of the resistor elements, the active regions extending in a direction perpendicular to the direction in which the resistor elements extend. This allows the diffusion layer resistor elements to be laid out by making effective use of available spaces.

The resistor elements may be topped with a wiring film of a predetermined pattern, and the ratio of the area of each of the resistor elements to the area of the wiring film overlapping with the element in question may be held substantially constant. This prevents the resistor elements from losing their consistency in resistance value under the influence of the wiring layer.

The resistor elements may be formed by a layer constituting gate electrodes of MOS transistors. This makes it possible to form both the gates and the resistor elements simultaneously.

Beside the claimed invention, the present invention includes various aspects as described above and summarized as follows.

According to one aspect of the present invention, a semiconductor device has a plurality of resistor elements formed on insulating film in predetermined regions on a surface of a semiconductor substrate. The semiconductor device comprises active regions contiguous with the resistor elements. The semiconductor device, wherein the resistor elements are constituted by a polycrystal silicon film and a silicide film stacked to make up a polycide structure, the silicide film is selectively removed from tops of the resistor elements.

According to another aspect of the present invention, the dummy gate electrodes are constituted by a polycrystal silicon film and a silicide film stacked to make up a polycide structure.

According to another aspect of the present invention, the active regions are doped with suitable impurities and are connected to contact layers so that the active regions function as diffusion layer resistor elements.

According to another aspect of the present invention, the active regions are located close to lengthwise ends of the resistor elements, the active regions extending in a direction perpendicular to the direction in which the resistor elements extend.

According to another aspect of the present invention, the resistor elements are topped with a wiring film of a predetermined pattern, and wherein the ratio of the area of each of the resistor elements to the area of the wiring film overlapping with the element in question is held substantially constant.

According to another aspect of the present invention, a method of manufacturing a semiconductor device comprises the following steps. Firstly etching is performed to remove surroundings of a plurality of parallelly arranged strip-shaped rectangular regions in predetermined regions on a semiconductor substrate in order to have trenches formed by the rectangular regions left intact. Secondly the trenches is filled with insulating film formed on the semiconductor substrate. Thirdly surfaces of the insulating film is polished for removal thereof from regions except those of the trenches, thereby the rectangular regions established as active regions and the surfaces of the insulating film on the trenches is planarized. Fourthly conductive film using a material having a predetermined resistance value is formed on the semiconductor substrate. Fifthly the conductive film on the insulating film is patterned so as to form rectangular resistor elements extending between any adjacent two of the active regions and in parallel with the active regions. The fifth step produces a plurality of the resistor elements between any adjacent two of the active regions.

According to another aspect of the present invention, a plurality of the dummy gate electrodes are formed in each of the active regions.

According to another aspect of the present invention, a method of manufacturing a semiconductor device comprises the following steps. Firstly a semiconductor substrate in predetermined regions thereof is etched selectively so as to form a plurality of parallelly arranged rectangular trenches. Secondly the trenches is filled with insulating film formed on the semiconductor substrate. Thirdly surfaces of the insulating film is polished for surface planarization of the insulating film on the trenches while removing the insulating film from regions except those of the trenches, thereby establishing the regions other than those of the trenches as active regions surrounding the insulating film. Fourthly conductive film using a material having a predetermined resistance value is formed on the semiconductor substrate. Fifthly the conductive film on the insulating film is patterned so as to form resistor elements made of the conductive film on the insulating film filling the plurality of rectangular trenches.

According to another aspect of the present invention, a distance between any adjacent two of the trenches is determined by a permissible range of resistance values of the resistor elements formed in the fifth step.

According to another aspect of the present invention, the fifth step forms the resistor elements while patterning the conductive film on the active regions so as to manufacture dummy gate electrodes surrounding the resistor elements.

According to another aspect of the present invention, the fifth step produces the resistor elements while patterning gate electrodes of MOS transistors formed by the conductive film outside the predetermined regions.

According to another aspect of the present invention, a distance between each of the resistor elements and each of the dummy gate electrodes is set to a minimum space between patterns formed by the conductive film on the semiconductor substrate.

According to another aspect of the present invention, the dummy gate electrodes are formed so as to cover entirely the active regions.

According to another aspect of the present invention, the method further comprises the step of implanting impurities into the active regions, thereby turning the active regions into diffusion layer resistor elements.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-59948, filed on Mar. 5, 2001 including specification, claims, drawings and summary, on which the Convention priority of the present application is based, are incorporated herein by reference in its entirety.

The invention claimed is:

1. A semiconductor device comprising:
   a semiconductor substrate;
   an active region formed on a surface of said semiconductor substrate;
   a plurality of isolating regions formed within said active region;
   a MOS transistor formed within said active region and having a gate oxide film and a gate electrode formed on said gate oxide film;
   a resistor element formed on each of said isolating regions, said resistor element being formed by the same layer of said gate electrode of said MOS transistor wherein each of said isolating regions are completely surrounded by said active region when viewed in plan view.

2. The semiconductor device according to claim 1, wherein said isolating regions are formed with a silicon oxide film buried in a groove on the surface of said semiconductor substrate.

3. The semiconductor device according to claim 1, wherein a plurality of said isolating regions are arranged parallel to each other in vertical direction to the long side of said isolating regions in a plan view.

4. The semiconductor device according to claim 3, wherein a plurality of said isolating regions are arranged evenly spaced apart.

5. The semiconductor device according to claim 1, wherein said resistor element is formed uniformly in predetermined length, predetermined width and predetermined thickness.

6. A semiconductor device comprising:
   a semiconductor substrate;
   a plurality of isolating regions formed on a surface of said semiconductor substrate within an active region;
   said active region completely surrounding each of said isolating regions when viewed in plan view;
   a MOS transistor formed within said active region and having a gate oxide film and a gate electrode formed on said gate oxide film;
   a resistor element formed on each of said isolating regions, said resistor element being formed by the same layer of said gate electrode of said MOS transistor;
   wherein said each of said isolating regions are arranged in the vicinity of each other.

7. The semiconductor device according to claim 6, wherein said isolating regions are formed with a silicon oxide film buried in a groove on the surface of said semiconductor substrate.

8. The semiconductor device according to claim 6, wherein a plurality of said isolating regions are arranged parallel to each other in vertical direction to the long side of said isolating regions in a plan view.

9. The semiconductor device according to claim 8, wherein a plurality of said isolating regions are arranged evenly spaced apart.

10. The semiconductor device according to claim 6, wherein said resistor element is formed uniformly in predetermined length, predetermined width and predetermined thickness.

* * * * *